United States Patent [19]

Ganesan et al.

[11] Patent Number: 5,554,569

[45] Date of Patent: Sep. 10, 1996

[54] METHOD AND APPARATUS FOR IMPROVING INTERFACIAL ADHESION BETWEEN A POLYMER AND A METAL

[75] Inventors: Sankaranarayanan Ganesan, Chandler; Howard M. Berg, Scottsdale, both of Ariz.

[73] Assignee: Motorola, Inc., Schaumburg, Ill.

[21] Appl. No.: 254,842

[22] Filed: Jun. 6, 1994

[51] Int. Cl.⁶ ........................... H01L 21/60
[52] U.S. Cl. ............... 437/207; 437/209; 437/214; 437/217; 437/219; 437/220
[58] Field of Search ................ 437/207, 209, 437/214, 217, 218, 219, 220

[56] References Cited

U.S. PATENT DOCUMENTS

| | | |
|---|---|---|
| 2,244,771 | 6/1941 | Figour . |
| 5,009,974 | 4/1991 | Honda et al. . |
| 5,147,822 | 9/1992 | Yamazaki et al. ............ 437/219 |
| 5,164,815 | 11/1992 | Lim ............................. 257/666 |
| 5,197,234 | 3/1993 | Gillenwater . |
| 5,205,036 | 4/1993 | Yamazaki ..................... 437/217 |
| 5,227,661 | 7/1993 | Heinen ......................... 257/666 |
| 5,254,137 | 10/1993 | Mitani ...................... 148/DIG. 138 |
| 5,358,906 | 10/1994 | Lee ............................ 437/217 |

FOREIGN PATENT DOCUMENTS 454501  1/1992  Japan .

*Primary Examiner*—Kevin M. Picardat
*Attorney, Agent, or Firm*—Rennie William Dover

[57] ABSTRACT

A leadframe (11) and a method for improving adhesion of a polymer (17, 19) to the leadframe (11). The leadframe (11) has a flag (14) having a top surface (15) and a bottom surface (18), and leads (12). Microscopic locking features (31) are formed in the top surface (15) and the bottom surface (18) of flag (14) by bombarding the flag (14) with a grit material. Thus, the top and bottom surfaces (14, 18) are roughened. A semiconductor die (13) is attached to the flag (14) by a die attach material (17) and the flag (13), the semiconductor material (13), and portions of the leads (12) are encapsulated by a molding compound. The pits improve the adhesion of the die attach material (17) and the molding compound (19) to the leadframe (11).

16 Claims, 1 Drawing Sheet

5,554,569

METHOD AND APPARATUS FOR IMPROVING INTERFACIAL ADHESION BETWEEN A POLYMER AND A METAL

BACKGROUND OF THE INVENTION

The present invention relates, in general, to semiconductor packages, and more particularly, to substrate-polymer interfaces of semiconductor packages.

Generally, semiconductor die are encapsulated within packages to prevent them from becoming damaged by external stresses and to provide a means for carrying electrical signals to and from the devices in the semiconductor die. Included in the repertoire of semiconductor die package types are dual-in-line packages, TAB packages, plastic quad flat packages, plastic ball grid array packages, and multichip modules. A common technique for packaging semiconductor die includes mounting them to a support, such as a leadframe, and encapsulating the semiconductor die and a portion of the leadframe within a polymer such as a mold compound.

An important aspect in packaging semiconductor die within a mold compound is preventing delamination of the mold compound from the substrate to which the semiconductor die are mounted. Typically, delamination occurs at the weakest interfaces between the mold compound and the substrate, resulting in the accumulation of moisture at the delamination sites. During high temperature process steps, e.g., solder reflow processes, the moisture vaporizes and causes the semiconductor package to crack via a phenomenon commonly referred to as a "popcorn effect."

To prevent delamination from occurring, semiconductor device manufacturers have sought ways to improve the interfacial adhesion between the polymer and the substrate. One technique for improving adhesion is to treat the substrate surface with silane. Although silane treatment improves mold compound adhesion, it is difficult to selectively deposit the silane and to control the thickness of the deposited silane. In addition, silane has a relatively short shelf-life and is susceptible to degradation during high temperature exposures such as occurs during die bond cure and wire bond processing steps. Thus, the leadframes must be treated with silane just before the encapsulation by the mold compound. Another technique for decreasing delamination is to form oxides on the substrate, e.g., cuprous or cuptic oxides on a copper leadframe. However, selectively forming oxides on the leadframe is difficult and expensive.

Accordingly, it would be advantageous to have a substrate and a method for improving interfacial adhesion between a polymer and the substrate. In addition, it would be advantageous for the substrate and the method to be simple, inexpensive, and to readily fit into standard packaging regimes.

DETAILED DESCRIPTION OF THE DRAWINGS

Generally, the present invention provides a method for improving interfacial adhesion between a polymer, such as die attach or mold compounds, and a metal surface or a metal alloy surface, such as leadframe surfaces or die pad surfaces on printed wiring boards. Interfacial adhesion is improved by roughening a portion of the metal or metal alloy surface, thereby increasing the surface area of the substrate and thus the number of contact sites to which the polymer can bond. In other words, increasing the surface area of the substrate increases the amount of polymer in contact with the substrate, thereby providing a higher resistance to delamination of the die attach material or mold compound from the metal surface. In addition, the roughened substrate surface has microscopic protrusions (shown in FIG. 2) that serve as locking features that further strengthen the bond between the polymer and the substrate surface. In accordance with the method of the present invention, the surface of the leadframe is roughened by bombarding it with a grit material in a gaseous medium.

Figure 1:
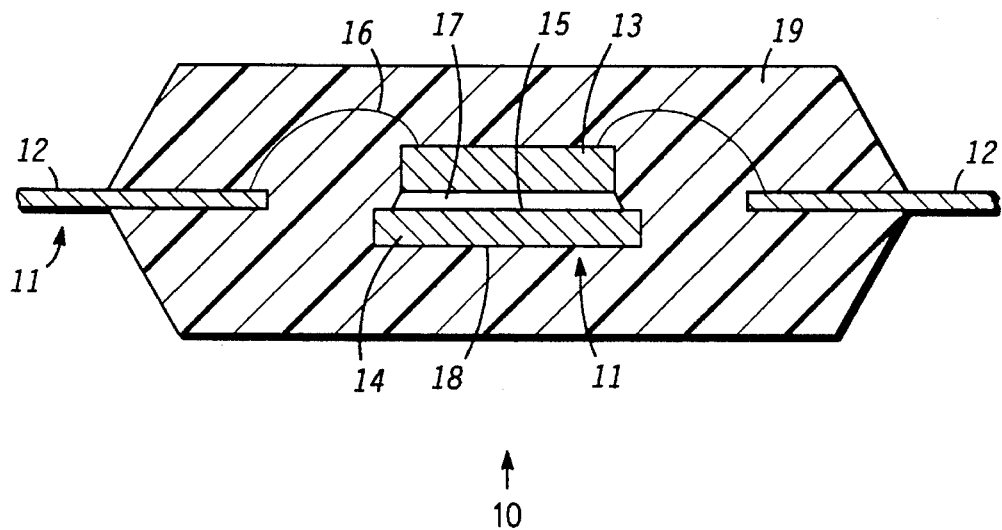
FIG. 1 illustrates a cross-sectional view of a semiconductor die mounted to a semiconductor leadframe roughened in accordance with a first embodiment of the present invention.

FIG. 1 illustrates a cross-sectional view of a semiconductor die 13 mounted to a semiconductor leadframe 11 roughened in accordance with a first embodiment of the present invention. More particularly, leadframe 11 includes leads 12 and a flag 14 having a top surface 15 and a bottom surface 18 roughened using a high velocity gas stream in which abrasive particles are suspended. In other words, surfaces 15 and 18 are bombarded with a grit material carried in a gaseous medium, i.e., one of the metal or metal alloy surface is gritblasted. Preferably, the gaseous medium carrying the grit material blown at leadframe 11 contacts leadframe 11 at a pressure ranging between approximately 0.20 megaPascals and approximately 0.70 megaPascals. The abrasive particles may be grit materials such as, for example, sand, silicon dioxide, aluminum oxide, silicon carbide, bicarbonates, and the like. The gaseous medium may be, for example, nitrogen, argon, air, and the like.

The grit material roughens top and bottom surfaces 15 and 18, respectively, by creating pits in surfaces 15 and 18, which increase the surface area of leadframe 11. Preferably, the metal surfaces have an average surface roughness of at least 1,500 angstroms after being roughened by the grit material. Average surface roughness is defined as the average vertical peak to trough distance along surface 15 and along surface 18, and illustrated by arrows 32 of FIG. 2. Although only surfaces 15 and 18 of flag 14 are shown as being roughened, it should be understood that roughening of metal surfaces to improve polymer adhesion is not restricted to leadframe flag surfaces only, but applies to any part of the leadframe including tie bars, leadframe fingers, and the like. It should also be understood that suitable materials for the leadframe include metals such as copper and aluminum, as well as metal alloys such as alloys of copper, alloys of aluminum, and alloys of nickel such as an iron-nickel alloy. The leadframe may also have a palladium-nickel preplated surface. Other suitable materials that may be roughened in accordance with the present invention include plated metal surfaces such as, for example, silver plated or gold plated surfaces.

Figure 2:
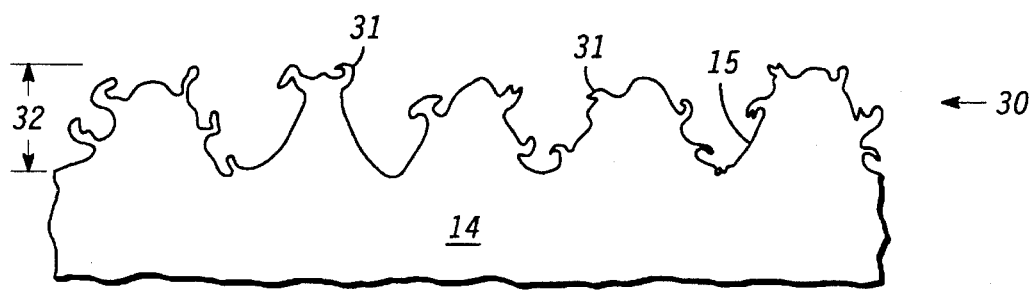
FIG. 2 illustrates an enlarged view of a portion the semiconductor leadframe of FIG. 1.

Now referring to FIG. 2, an enlarged view of the portion of gritblasted surface 15 of flag 14 is shown. Surface 15 has macroscopic undulations 30 characterized by the average surface roughness (shown by arrows 32). In addition, surface 15 has microscopic locking features 31 along undulations 30 of surface 15. It should be understood that macroscopic undulations 30 and microscopic locking features 31 cooperate to increase the resistance to delamination between the polymer and surface 15, i.e., the polymer-metal interface.

Referring again to FIG. 1, semiconductor die 13 is coupled to surface 15 of flag 14 by means of an adhesive material 17. Suitable materials for adhesive material 17 include thermoset or thermoplastic epoxy die attach materials, silicone based die attach materials, and polyimide based die attaches. Leads 12 are coupled to flag 14 by interconnects 16. Subsequently, semiconductor die 13, flag 14, interconnects 16, and portions of leads 12 are encapsulated within mold compound 19 using, for example, a transfer molding process. The pits in surfaces 15 and 18 increase the surface area and the number of microscopic locking features of flag 14, thereby increasing the contact area and strengthening the adhesion of die attach material and mold compound to leadframe 11. Materials for attaching semiconductor die to substrates such as a leadframe as well as materials for encapsulating the semiconductor die and leadframes are well known to those skilled in the art.

Figure 3:
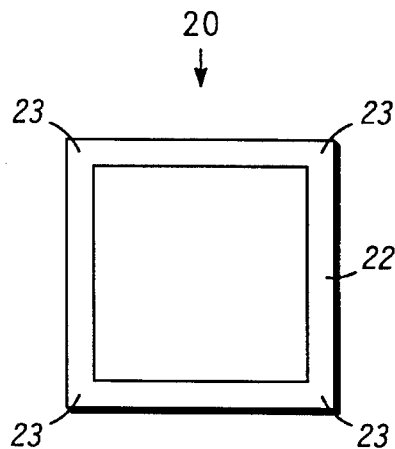
FIG. 3 illustrates a plan view of a leadframe flag surface in accordance with a second embodiment of the present invention.

FIG. 3 illustrates a second embodiment of a leadframe flag or die pad 20 roughened in accordance with the present invention. Generally, macroscopic delamination of die attach materials and mold compounds is initiated along the edges and at the corners of leadframe flags such as leadframe flag 20 because microscopic delamination forces are amplified in these regions. Accordingly, in the second embodiment of the present invention, leadframe flag 20 is roughened along the periphery 22 and in the corners 23 of leadframe flag 20. In other words, critical portions of the surfaces of leadframe flag 20 are preferentially roughened, i.e., the corners 23 of leadframe flag 20 as well as the portions of leadframe flag 20 adjacent the edges. Although only one major surface of leadframe flag 20 is shown, it is preferable that both the periphery and the corners of both the top and bottom major surfaces of leadframe flag 20 be roughened. Thus, a plurality of portions of the semiconductor leadframe are roughened.

Figure 4:
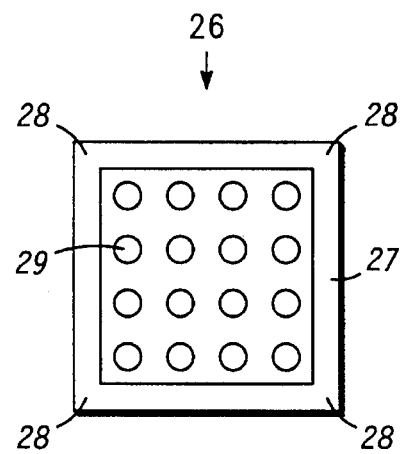
FIG. 4 illustrates a plan view of a leadframe flag surface in accordance with a third embodiment of the present invention.

FIG. 4 illustrates a third embodiment of a leadframe flag or die pad 26 roughened in accordance with the present invention. In this embodiment, the periphery 27, corners 28, and localized central regions 29 of the major surfaces of leadframe flag 26 are roughened. Polymers such as mold compounds and die attach materials strongly adhere to the roughened localized central regions. Thus, these regions of high adhesion impede the spreading of delamination, if delamination has been initiated.

By now it should be appreciated that a method of improving the delamination resistance between a polymer and a metal or a metal alloy surface has been provided. This method provides a simple, low-cost technique for improving adhesion of a polymer to a leadframe that is robust to package assembly processes and is independent of the metal or metal alloy surface. Adhesion of the die attach or mold compounds to the metallic surface is increased by the formation of microscopic locking features in the metallic surface. In addition, undulations are formed in the metallic surface that cooperate with the microscopic locking features to further increase the resistance of delamination of the die attach or mold compounds from the metallic surface. An important advantage of the surface roughening technique of the present invention over chemical roughening techniques is the formation of microscopic locking features. More particularly, it is believed that microscopic locking features are not formed using chemical roughening methods and that these features significantly increase the adhesion of the die attach or mold compounds to the metallic surfaces.

While we have shown and described specific illustrative embodiments of the present invention, different embodiments, modifications and improvements will occur to those skilled in the art. We desire it to be understood, therefore, that this invention is not limited to the particular forms shown. We intend in the appended claims to cover all modifications that do not depart from the spirit and scope of this invention. For example, the die pads or chip pad locations on a printed wiring board may be roughened to improve adhesion of the polymer.

We claim:

1. A method for improving an interfacial adhesion between a polymer and one of a metal surface or a metal alloy surface, comprising the steps of:

providing the one of a metal surface or a metal alloy surface;

bombarding the one of a metal surface or a metal alloy surface with a grit material, the grit material suspended in a gaseous carrier medium; and encapsulating a portion of the one of a metal surface or a metal alloy surface with a molding compound.

2. The method of claim 1, wherein the step of bombarding the one of a metal surface or a metal alloy surface with a grit material further comprises gritblasting the one of a metal surface or a metal alloy surface.

3. The method of claim 1, wherein the step of providing the one of a metal surface or a metal alloy surface includes providing a semiconductor leadframe having a surface, the semiconductor leadframe selected from the group consisting of a metal and a metal alloy.

4. The method of claim 3, wherein the step of providing a semiconductor leadframe includes providing a copper semiconductor leadframe.

5. The method of claim 3, wherein the step of bombarding the one of a metal surface or a metal alloy surface with a grit material includes bombarding the one of a metal surface or a metal alloy surface until the surface of one of a metal surface or a metal alloy surface has microscopic locking features.

6. The method of claim 1, wherein the step of encapsulating a portion of the one of a metal surface or a metal alloy surface with a molding compound includes mounting a semiconductor die to the portion of the one of a metal surface or a metal alloy surface.

7. The method of claim 1, wherein the step of bombarding the one of a metal or metal alloy surface with a grit material includes altering the one of a metal or metal alloy surface to have undulations.

8. A method for improving interfacial adhesion between a polymer and a semiconductor leadframe, comprising the steps of:

providing the semiconductor leadframe;

roughening a portion of the semiconductor leadframe using a grit material carried via a gaseous medium;

mounting at least one semiconductor die to the semiconductor leadframe; and encapsulating the at least one semiconductor die and a portion of the semiconductor leadframe in the polymer.

9. The method of claim 8, wherein the step of providing the semiconductor leadframe includes providing the semiconductor leadframe as a copper alloy.

10. The method of claim 8, wherein the step of providing the semiconductor leadframe includes providing the semiconductor leadframe as an iron-nickel alloy.

11. The method of claim 8, wherein the step of providing the semiconductor leadframe includes providing the semiconductor leadframe plated with a metal selected from the group palladium-nickel alloy, nickel, silver, and gold.

12. The method of claim 8, wherein the step of roughening a portion of the semiconductor leadframe includes roughening a portion of the semiconductor leadframe includes using a grit material selected from the group consisting of sand, silicon dioxide, aluminum oxide, silicon carbide, and bicarbonates.

13. The method of claim 8, wherein the step of roughening a portion of the semiconductor leadframe includes blowing the grit material at the portion of the semiconductor leadframe in the gaseous carrier medium, wherein the grit material arrives at the semiconductor leadframe at a pressure ranging between approximately 0.20 megaPascals and approximately 0.70 megaPascals.

14. The method of claim 8, wherein the step of roughening a portion of the semiconductor leadframe includes providing the gaseous carrier medium as a gas selected from the group consisting of nitrogen, argon, and air.

15. The method of claim 8, wherein the step of roughening a portion of the semiconductor leadframe includes roughening a plurality of portions of the semiconductor leadframe.

16. The method of claim 8, wherein the step of roughening a portion of the semiconductor leadframe includes forming microscopic locking features on the semiconductor leadframe.

* * * * *